United States Patent
Wang et al.

(10) Patent No.: US 7,057,237 B2
(45) Date of Patent: Jun. 6, 2006

(54) METHOD FOR FORMING DEVICES WITH MULTIPLE SPACER WIDTHS

(75) Inventors: Howard Chih Hao Wang, Hsinchu (TW); Chenming Hu, Alamo, CA (US); Chun-Chieh Lin, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/798,063

(22) Filed: Mar. 11, 2004

(65) Prior Publication Data

US 2005/0051866 A1     Mar. 10, 2005

(30) Foreign Application Priority Data

Jun. 9, 2003  (TW) ................................ 92115512 A

(51) Int. Cl.
  *H01L 21/266*  (2006.01)
(52) U.S. Cl. ...................... 257/344; 438/230; 438/241; 257/408
(58) Field of Classification Search ................ 438/199, 438/230, 231, 233, 241, 303, 305, 307, 587, 438/595, 981; 257/314, 344, 371, 391, 402, 257/404, 408, 900
See application file for complete search history.

(56) References Cited

U.S. PATENT DOCUMENTS

| | | | | |
|---|---|---|---|---|
| 5,021,354 A | * | 6/1991 | Pfiester | 438/230 |
| 5,874,330 A | * | 2/1999 | Ahn | 438/230 |
| 6,214,715 B1 | * | 4/2001 | Huang et al. | 438/597 |
| 6,248,623 B1 | | 6/2001 | Chien et al. | 438/241 |
| 6,316,304 B1 | | 11/2001 | Pradeep et al. | 438/230 |
| 6,344,398 B1 | | 2/2002 | Hsu | 438/303 |
| 6,504,192 B1 | * | 1/2003 | Hasunuma | 257/288 |

* cited by examiner

*Primary Examiner*—Thomas L. Dickey
(74) *Attorney, Agent, or Firm*—Haynes and Boone, LLP

(57) ABSTRACT

A method is described for forming three or more spacer widths in transistor regions on a substrate. In one embodiment, different silicon nitride thicknesses are formed above gate electrodes followed by nitride etching to form spacers. Optionally, different gate electrode thicknesses may be fabricated and a conformal oxide layer is deposited which is subsequently etched to form different oxide spacer widths. A third embodiment involves a combination of different gate electrode thickness and different nitride thicknesses. A fourth embodiment involves selectively thinning an oxide layer over certain gate electrodes before etching to form spacers. Therefore, spacer widths can be independently optimized for different transistor regions on a substrate to enable better drive current in transistors with narrow spacers and improved SCE control in neighboring transistors with wider spacers. Better drive current is also obtained in transistors with shorter polysilicon thickness.

18 Claims, 8 Drawing Sheets

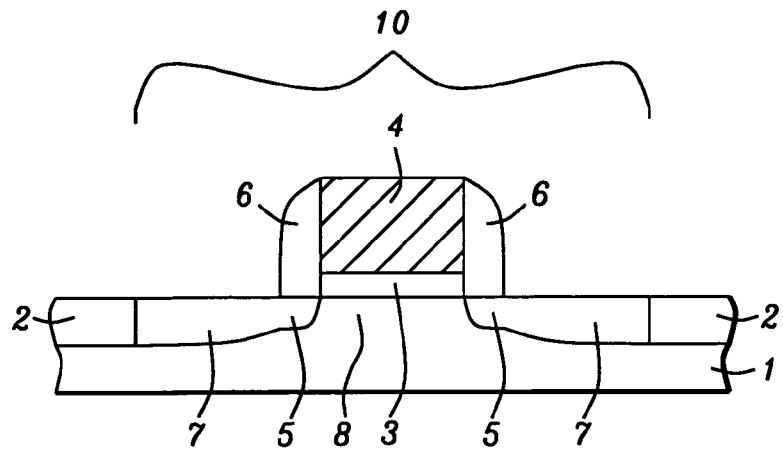
FIG. 1 – Prior Art
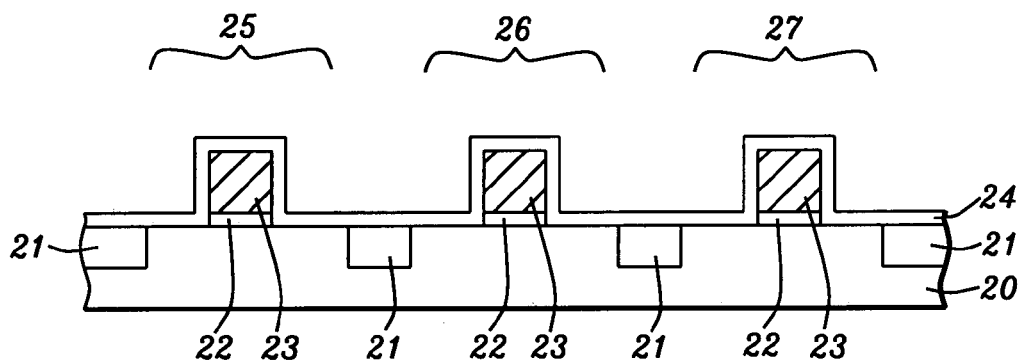
FIG. 2a
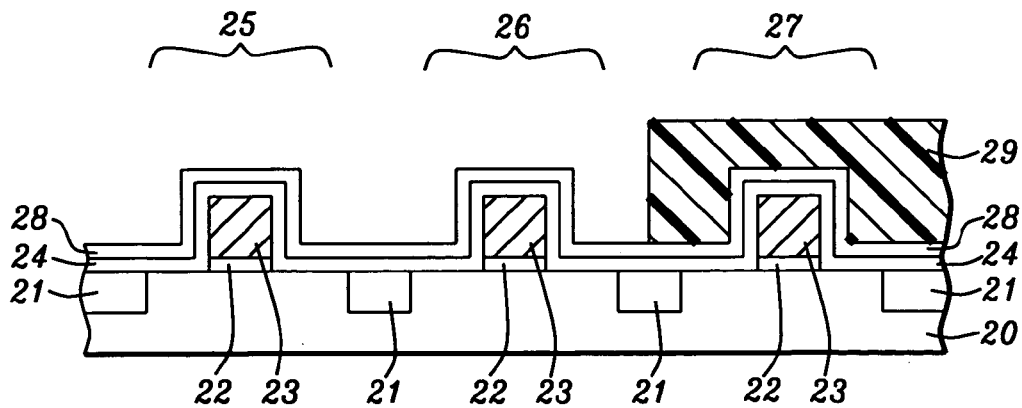
FIG. 2b

METHOD FOR FORMING DEVICES WITH MULTIPLE SPACER WIDTHS

FIELD OF THE INVENTION

The invention relates to the fabrication of an integrated circuit in a semiconductor device. More particularly, the present invention is directed to a transistor structure comprised of a plurality of gate electrodes having multiple spacer widths and a method for making the same.

BACKGROUND OF THE INVENTION

A trend in the integrated circuit industry is to increase the functionality on a chip such that two or more types of transistor devices are produced on the same substrate. For instance, embedded DRAM or embedded SRAM involve the production of memory devices and logic devices on the same chip. Furthermore, the transistors for the logic component may consist of different functions such as an I/O device and a high performance device.

A typical transistor 10 is shown in FIG. 1 and is comprised of a substrate 1 with isolation regions 2 that separate transistor 10 from adjacent devices. A gate oxide layer 3 and a gate electrode 4 are formed on substrate 1. An ion implant is performed to generate lightly doped source/drain (LDD) regions 5. Spacers 6 are fabricated on the sidewalls of the gate electrode 4. Then a second ion implant is typically performed to produce heavily doped source/drain regions 7. The channel 8 is located beneath the gate electrode and between source/drain regions.

Each transistor device has a separate set of requirements or ground rules in order to optimize performance. The design typically includes a specific gate length, a width for the LDD regions, and a spacer width among other details. Devices with a narrow spacer width exhibit better performance (drive current) because of a lower series resistance. However, devices with larger spacer widths are better for short channel effect (SCE) control. Conventional fabrication methods only allow for one spacer width and therefore a compromise between performance and SCE control must be made. A better process is needed whereby up to three or more transistor devices on a substrate can be independently optimized for performance and SCE control.

A better drive current in transistor 10 can also be achieved by a smaller thickness of the gate electrode 4 which is commonly comprised of polysilicon. A smaller gate electrode thickness leads to improved drive current because of better polysilicon activation. Therefore, an improved process is needed with the flexibility to produce transistors with different gate electrode thicknesses in order to adjust the drive current and satisfy the device specifications.

Transistor devices on a wafer with different spacer widths are claimed in U.S. Pat. No. 6,344,398. One device has an oxide spacer adjacent to a gate while a second device has a nitride spacer on a gate covered by an oxide layer and a third device has no spacer. Although two different spacer widths are an improvement over conventional methods, additional flexibility such as provision for three or more spacer widths is desirable for advanced technologies.

In related art, U.S. Pat. No. 5,874,330 describes a method of forming different sidewall thicknesses on gate electrodes in cell and peripheral circuitry regions. A nitride layer is deposited on the gates and selectively removed from the peripheral regions. Then an oxide layer with a different thickness is deposited and etched back to afford an oxide sidewall in peripheral regions and an oxide layer over nitride sidewalls in cell regions.

U.S. Pat. No. 6,248,623 refers to embedded DRAM technology in which a three layer spacer consisting of a nitride layer between two oxide layers is formed. The spacer width in the memory cell region is different than the spacer width in the logic region. However, there is no provision to form two different spacer widths in the logic region.

U.S. Pat. No. 6,316,304 describes the formation of two different spacer widths on adjacent transistors. A stack comprised of a thin oxide layer, a nitride layer and a first oxide spacer layer is formed over adjacent gate electrodes. The first oxide spacer is selectively removed over one transistor and then a second oxide spacer layer is deposited. The oxide spacer layers are etched to produce a thinner spacer on the gate electrode that has only one oxide spacer layer thickness.

SUMMARY OF INVENTION

One objective of the present invention is to provide a method of forming devices with three or more different spacer widths on a single substrate by etching different thicknesses of spacer layers.

A further objective of the present invention is to provide a method of forming devices with three or more different spacer widths on a single substrate by etching a spacer layer over gate electrodes with different thicknesses.

A still further objective of the present invention is to provide a method of fabricating devices with three or more different spacer widths that is based on a combination of different gate electrode thicknesses and different thicknesses of spacer layers.

Yet another objective of the present invention is to provide a transistor structure with three or more spacer widths so that transistors with different functionality can be individually optimized on a substrate.

These objectives are achieved in one embodiment by providing a substrate having first, second, and third transistor regions comprised of a gate electrode on a gate dielectric layer that are separated by isolation regions. An oxide layer is deposited on the substrate followed by deposition of a silicon nitride layer. A photoresist mask is formed over a first transistor region and the nitride layer is removed from the second and third transistor regions. After the photoresist is removed, a second silicon nitride layer is deposited on the substrate. A second photoresist mask is formed over the first and second transistor regions and then the second nitride layer is removed from the third transistor region. After the second photoresist is removed, a third silicon nitride layer is deposited on the substrate. The nitride layers are etched to produce spacers on the gate electrodes in each transistor region with the first transistor region having a first spacer width, the second transistor region having a second spacer width less than the first spacer width, and the third transistor region having a third spacer width less than the second spacer width.

In a second embodiment, a substrate is provided that is comprised of first, second, and third transistor regions having a gate dielectric layer and separated by isolation regions. A first gate layer is selectively formed in the first transistor region. Then a second gate layer is selectively formed in the first and second transistor regions. Next, a third gate layer is formed in the first, second, and third transistor regions so that the total gate layer thickness is highest in the first transistor region and smallest in the third transistor region. A photoresist is patterned on the gate layers and the pattern is etch transferred through the gate layers to form gate electrodes having different thicknesses. The gate electrode in the first transistor region has the largest thickness while the gate electrode in the third transistor region has the smallest thickness. After the photoresist is stripped, an oxide layer is formed in each transistor region. A subsequent etch is used to form oxide spacers adjacent to each gate electrode. Spacers in the first transistor region have a larger width than spacers in the second transistor region which have a larger width than spacers in the third transistor region.

In a third embodiment, three or more spacer widths are formed by a process involving a combination of different gate electrode thicknesses and different silicon nitride layer thicknesses. A substrate is provided that is comprised of first, second, and third transistor regions having a gate dielectric layer and separated by isolation regions. A first gate layer is selectively formed in the first and second transistor regions. A second gate layer is formed on the substrate to give a high gate layer thickness in the first and second transistor regions and a thinner gate layer in the third transistor region. A photoresist is patterned on the gate layer and the pattern is etch transferred through the gate layer to form gate electrodes with equal thickness in the first and second transistor regions and a thinner gate electrode in the third transistor region. After the photoresist is stripped, an oxide layer is deposited on the substrate followed by deposition of silicon nitride layer to give conformal oxide and nitride layers on the substrate. The silicon nitride layer is selectively removed from the second and third transistor regions. Then a second silicon nitride layer is deposited on the substrate. The nitride and oxide layers are etched back to generate spacers adjacent to each gate electrode. The first transistor region has wider spacers than the second transistor region which has wider spacers than the third transistor region.

In a fourth embodiment, an oxide layer is deposited on a substrate comprised of first, second, and third transistor regions with equal gate electrode thicknesses. The oxide layer is thinned in the second and third transistor regions while the oxide layer in the first transistor region is protected. The oxide layer in the three transistor regions is etched back to form oxide spacers of equal width in the second and third transistor regions and wider spacers in the first transistor region. A second oxide layer is deposited on the substrate and selectively thinned over the third transistor region. The second oxide layer is etched back to form oxide spacers adjacent to each gate electrode. Spacers formed in the first transistor region are wider than spacers in the second transistor region and the narrowest spacers are in the third transistor region.

The fifth embodiment involves forming different ARC thicknesses on a uniformly thick gate layer. The ARC may be an inorganic material such as silicon oxynitride with a first thickness in a first transistor region, a second thickness less than the first thickness in a second transistor region, and zero thickness in a third transistor region. After the gate electrodes are formed by conventional means, a conformal oxide layer is deposited on the substrate and is etched back to form the largest spacer width on the gate electrode with the thicker ARC cap layer and thinnest spacer width on the gate electrode with no ARC cap layer.

The present invention also encompasses the transistor structures formed by the methods of the first, second, third, fourth, and fifth embodiments described herein.

BRIEF DESCRIPTION OF THE DRAWINGS

FIG. 1 depicts a prior art example of a transistor with a gate electrode, sidewall spacers and source/drain regions.

FIGS. 2a–2e are cross-sectional views that depict formation of three spacer widths on a transistor structure according to the first embodiment of the present invention.

DETAILED DESCRIPTION OF THE INVENTION

The present invention is a method of forming three or more spacer widths in transistor regions on a single substrate. The process is compatible with the fabrication of both NMOS and PMOS transistors. The invention is not limited to the specific examples described herein. For example, a method is provided for producing three spacer widths on a substrate but the processes described herein may be repeated to generate more than three spacer widths as appreciated by those skilled in the art.

Figure 2C:
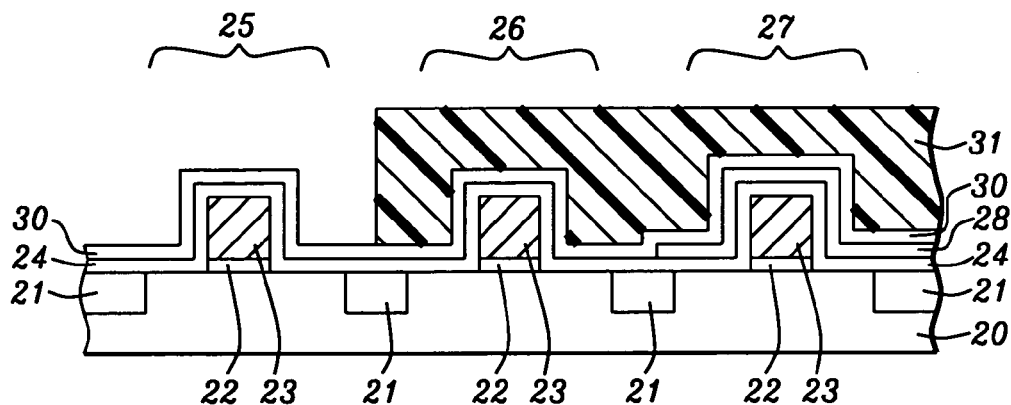

The first embodiment is set forth in FIGS. 2a–2e. Referring to FIG. 2a, a substrate 20 is provided which typically contains a plurality of transistor regions including transistor regions 25, 26, 27 that are also referred to as partially formed transistors. The substrate 20 is also comprised of n and p wells (not shown). Transistor regions 25, 26, 27 are separated by isolation regions 21 comprised of an insulating material such as silicon oxide. In this example, the isolation region 21 is a shallow trench isolation (STI) feature but may be another isolation feature used in the art. A bottom gate dielectric layer 22 and gate electrodes 23 comprised of polysilicon or another suitable gate material with a thickness of between about 100 and 2000 Angstroms are formed by conventional means in each transistor region 25, 26, 27. The dielectric layer 22 is usually comprised of silicon oxide, silicon oxynitride, or a metal oxide that is a high k dielectric material such as $Ta_2O_5$, $TiO_2$, $Al_2O_3$, $ZrO_2$, $HfO_2$, $Y_2O_3$ and $La_2O_5$ and has a thickness from about 2 to 100 Angstroms. An oxide layer 24 such as silicon oxide with a thickness of between 10 and 1000 Angstroms is deposited on the substrate 20 by a chemical vapor deposition (CVD) or plasma enhanced CVD (PECVD) technique.

Referring to FIG. 2b, a silicon nitride layer 28 having a thickness from about 10 to 1000 Angstroms is deposited on the oxide layer 24 by a CVD or PECVD method. In a preferred embodiment, the oxide layer 24 and silicon nitride layer 28 form a conformal coating on gate electrodes 23 and on substrate 20. Note that all three transistor regions 25, 26, 27 have an equivalent gate electrode thickness and an equal thickness of oxide layer 24 and silicon nitride layer 28 at this point. A photoresist is spin coated on the substrate 20 and baked to form first photoresist layer 29 which is subsequently patterned to generate a first photoresist mask 29 in transistor region 27.

As shown in FIG. 2c, the silicon nitride layer 28 is selectively removed from exposed transistor regions 25, 26 by treatment with a $H_3PO_4$ solution known to those skilled in the art. Then the first photoresist mask 29 is stripped by a plasma ashing that normally includes oxygen. Optionally, a wet stripper solution may be used to remove the first photoresist mask 29. A second silicon nitride layer 30 with a similar thickness to silicon nitride layer 28 is then deposited by a CVD or PECVD technique to afford a conformal layer on substrate 20. The total silicon nitride thickness afforded by the combination of silicon nitride layers 28, 30 in transistor region 27 is greater than the thickness of silicon nitride layer 28 in transistor regions 25, 26. Next a photoresist is coated on the substrate 20 and baked to give a second photoresist layer 31 that is patterned to generate a second photoresist mask 31 in transistor regions 26, 27.

Figure 2D:
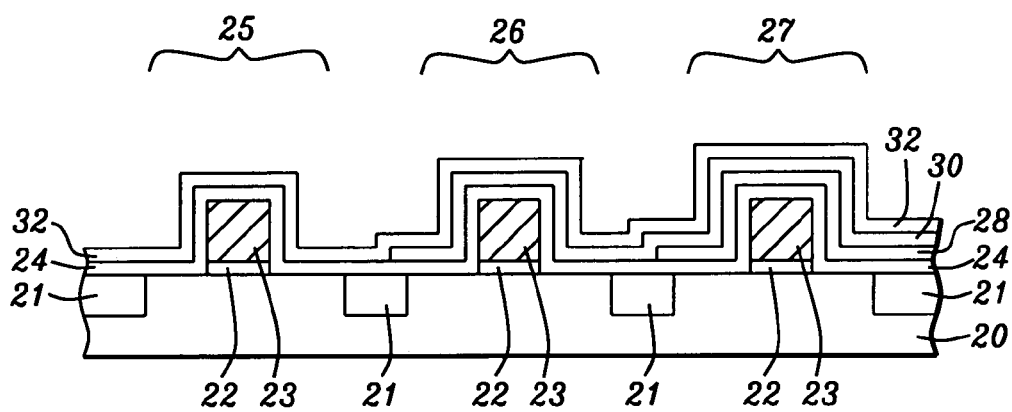

Referring to FIG. 2d, the exposed silicon nitride layer 30 in transistor region 25 is selectively removed using a method similar to that previously employed for removing the silicon nitride layer 28 in transistor regions 25, 26. The second photoresist mask 31 is then stripped by a plasma ashing method or with a stripper solution. A third silicon nitride layer 32 with a thickness similar to that of silicon nitride layer 28 is deposited on substrate 20 by a CVD or PECVD method. Note that the silicon nitride thickness resulting from silicon nitride layers 28, 30, 32 in transistor region 27 is greater than the combined thickness of silicon nitride layers 30, 32 in transistor region 26 which in turn is greater than the thickness of silicon nitride layer 32 in transistor region 25.

Figure 2E:
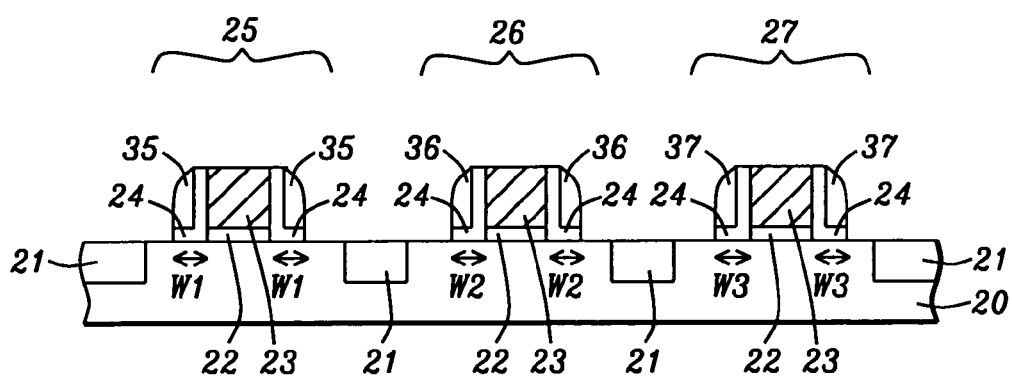

Referring to FIG. 2e, an anisotropic etch process is performed to produce silicon nitride spacers 35, 36, 37 on the oxide layer 24 adjacent to the sidewalls of gate electrode 23 and dielectric layer 22 in transistor regions 25, 26, 27, respectively. Endpoint for a first step is determined when the silicon nitride layer 32 is removed to expose oxide layer 24 in transistor region 25 and thereby form nitride spacer 35. The first step is followed by an in-situ over-etch step with the same nitride etch conditions to produce the larger nitride spacers 36 and 37, respectively, in transistor regions 26, 27. Subsequent etching as understood by those skilled in the art is performed to remove exposed portions of oxide layer 24 which includes removal of oxide layer 24 above gate electrodes 23 and between nitride spacers 35, 36, 37 and isolation regions 21.

It is understood that the oxide layer 24 may also be considered a spacer. The maximum spacer width $w_1$ in transistor region 25 is equivalent to the width of oxide layer 24 on the sidewall of gate electrode 23 plus the width of nitride spacer 35 at its base. Note that the nitride spacer 35 is comprised of only silicon nitride layer 32. The maximum spacer width $w_2$ in transistor region 26 is equal to the width of oxide layer 24 on the sidewall of gate electrode 23 plus the width of nitride spacer 36 at its base. The nitride spacer 36 is comprised of silicon nitride layers 30, 32. The maximum spacer width $w_3$ in transistor region 27 is equal to the width of oxide layer 24 on the sidewall of gate electrode 23 plus the width of nitride spacer 37 at its base. The silicon nitride spacer 37 is comprised of silicon nitride layers 28, 30, 32. As a result, the spacer 37 has a larger width $w_3$ than width $w_2$ for spacer 36 and width $w_2$ is larger than width $w_1$ for spacer 35. Therefore, three different spacer widths are produced by this method. This is an advantage over prior art where only two spacer widths are provided.

The partially formed transistors 25, 26, 27 are completed by conventional methods including formation of highly doped source/drain (S/D) regions (not shown). Additionally, a self-aligned silicide (salicide) process may be employed to form metal contacts above highly doped S/D regions and above the gate electrode.

Furthermore, the method of this embodiment may be expanded to generate more than 3 spacer widths. For example, there may be a fourth transistor region (not shown) that has a fourth gate electrode covered by the oxide layer 24 and third silicon nitride layer 32 similar to the gate electrode in transistor region 25. The third silicon nitride layer 32 is selectively removed over the fourth transistor region. Then a fourth silicon nitride layer (not shown) may be formed over the fourth transistor region and over transistor regions 25, 26, 27. The silicon nitride layers and oxide layer 24 are etched as described previously to form four different spacer widths wherein the width of the spacers in the fourth transistor region are less than the spacer widths in transistor region 25. The spacer widths in transistor region 25 are less than the spacer widths in region 26 which are less than the spacer widths in transistor region 27.

This embodiment enables more flexibility in the manufacturing process by allowing a unique spacer width on three or more different types of transistors so that each transistor can be independently optimized for improved performance. Thus, a better drive current is achieved for transistors with a smaller spacer width while better SCE control is realized in transistors with larger spacer widths.

The present invention is also a transistor structure formed by the method of the first embodiment. The transistor structure is comprised of a substrate having isolation regions and a plurality of transistor regions including first, second, and third transistor regions with a dielectric layer on the substrate between the isolation regions. There is a gate electrode having a first thickness formed in the first transistor region, a gate electrode having a second thickness formed in the second transistor region, and a gate electrode having a third thickness formed in the third transistor region. In addition, there are oxide spacers having a width formed adjacent to said gate electrodes in the first, second, and third transistor regions. The transistor structure is further comprised of silicon nitride spacers having a first width formed on the oxide spacers in the first transistor region, silicon nitride spacers having a second width less than the first width formed on the oxide spacers in the second transistor region, and silicon nitride spacers having a third width less than the second width formed on the oxide spacers in the third transistor region.

Figure 3A:
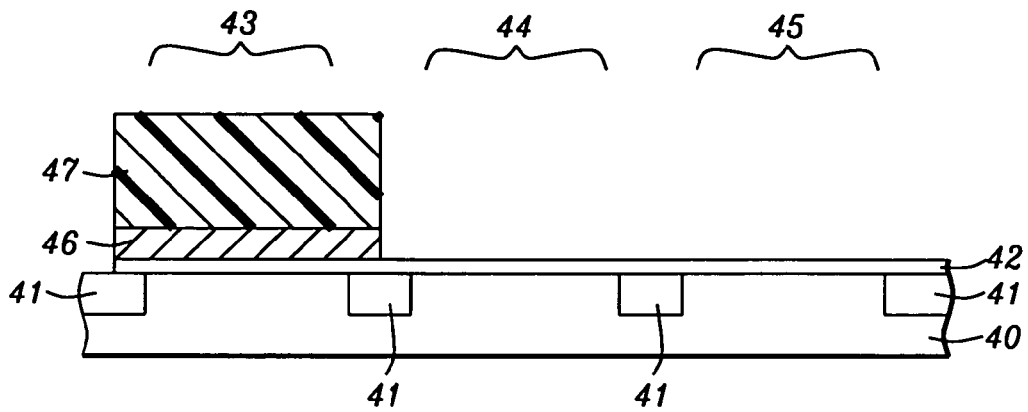
FIGS. 3a–3e are cross-sectional views that illustrate a method of forming three spacer widths on a transistor structure according to a second embodiment of the present invention.

A second embodiment is illustrated in FIGS. 3a–3e in which three different spacer widths are produced by first fabricating three different gate electrode thicknesses. Referring to FIG. 3a, a substrate 40 is shown that is typically comprised of a plurality of transistor regions including transistor regions 43, 44, 45. The substrate 40 is also typically comprised of n and p wells (not shown). Transistor regions 43, 44, 45 are separated by isolation regions 41 comprised of an insulating material such as silicon oxide. In this embodiment, the isolation region 41 is a shallow trench isolation (STI) feature although other types of isolation features known to those skilled in the art may be used. A gate dielectric layer 42 with a thickness of between 2 and 100 Angstroms is deposited on substrate 40 by conventional means. The gate dielectric layer 42 is comprised of silicon oxide, silicon oxynitride, or a metal oxide selected from the group including $Ta_2O_5$, $TiO_2$, $Al_2O_3$, $ZrO_2$, $HfO_2$, $Y_2O_3$ and $La_2O_5$.

A gate layer 46 comprised of polysilicon or amorphous silicon, for example, with a thickness of between 100 and 2000 Angstroms is deposited on dielectric layer 42 by a CVD or PECVD technique. The gate layer 46 may be doped or undoped. A photoresist is spin coated on the gate layer 46 and baked to form a first photoresist layer 47 which is patterned to form a first photoresist mask 47 in transistor region 43. An anti-reflective coating or ARC (not shown) comprised of an organic or inorganic material known to those skilled in the art may be coated on the gate layer 46 prior to forming the first photoresist layer 47 in order to optimize the process latitude for the patterning step. The gate layer 46 in transistor regions 44, 45 is removed by a conventional etching process.

Figure 3B:
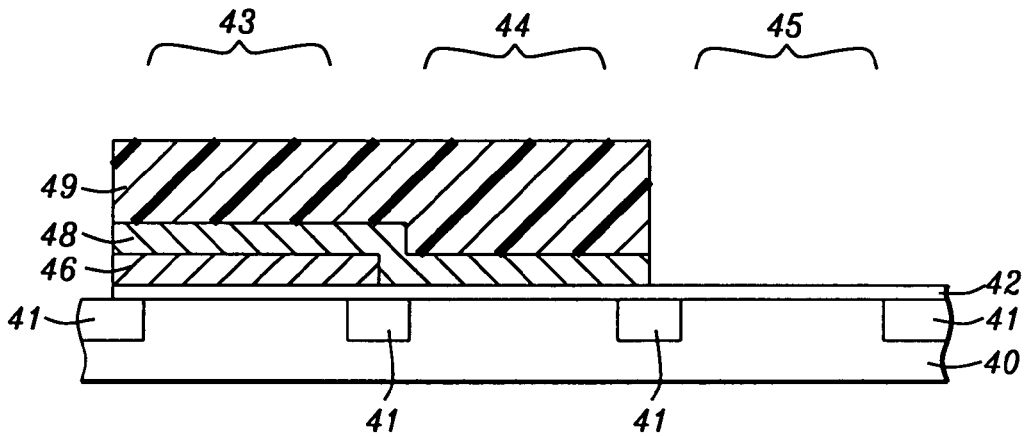

Referring to FIG. 3b, the first photoresist mask 47 is stripped by a plasma ashing method or with a wet stripper solution. A second gate layer 48 preferably comprised of the same material with a similar thickness as in gate layer 46 is deposited on the substrate including transistor regions 43, 44, 45. The combined thickness of gate layers 46, 48 in transistor region 43 is greater than the thickness of gate layer 48 in transistor regions 44, 45. Optionally, an organic or inorganic ARC (not shown) is coated on the gate layer 48 at this point. A photoresist is spin coated on substrate 40 and baked to form a second photoresist layer 49 that is patterned to form a second photoresist mask 49 in transistor regions 43, 44. The exposed gate layer 48 in transistor region 45 is removed by the same etch method used previously to remove the gate layer 46 in transistor regions 44, 45.

Figure 3C:
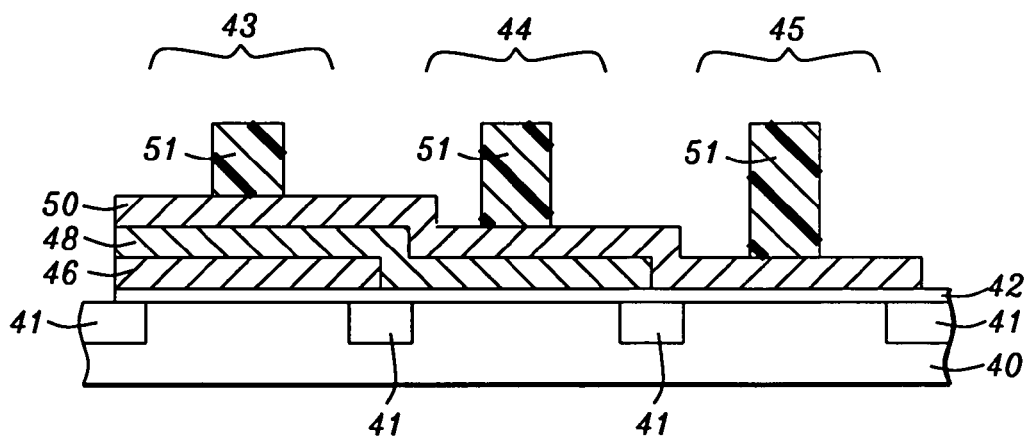

Referring to FIG. 3c, the second photoresist mask 49 is removed by plasma ashing or with a wet stripper. A third gate layer 50 preferably comprised of the same material with a similar thickness as in gate layer 46 is deposited on the substrate including transistor regions 43, 44, 45. The combined gate layer thickness resulting from gate layers 46, 48, 50 is greater in transistor region 43 than the combined thicknesses of gate layers 48, 50 in transistor region 44 which in turn is larger than the thickness of gate layer 50 in transistor region 45. Optionally, an ARC is coated on the gate layer 50. A photoresist is spin coated on substrate 40 and baked to form a third photoresist layer 51 which is patterned to form a third photoresist mask 51 that will be used to define a gate electrode in each transistor region 43, 44, 45.

Figure 3D:
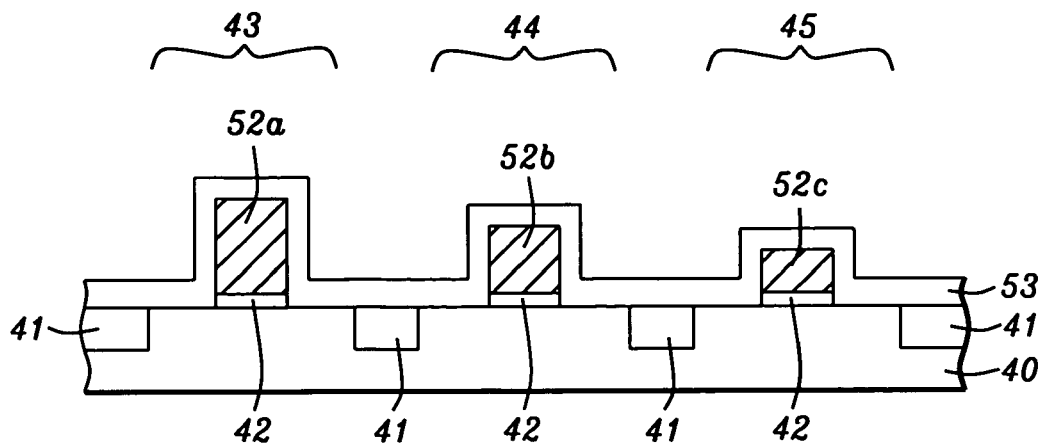

Referring to FIG. 3d, the pattern in photoresist layer 51 is transferred through gate layers 46, 48, 50 by a conventional etching process. Then exposed portions of the dielectric layer 42 are removed by an etch process such as a buffered HF dip. As a result, a gate electrode 52a is formed in transistor region 43, a gate electrode 52b is formed in transistor region 44, and a gate electrode 52c is formed in transistor region 45. Gate electrode 52a is comprised of gate layers 46, 48, 50 while gate electrode 52b is comprised of gate layers 48, 50 and gate electrode 52c is comprised of gate layer 50. An oxide such as silicon oxide is deposited to form a conformal oxide layer 53 on gate electrodes 52a, 52b, 52c and on substrate 40.

Figure 3E:
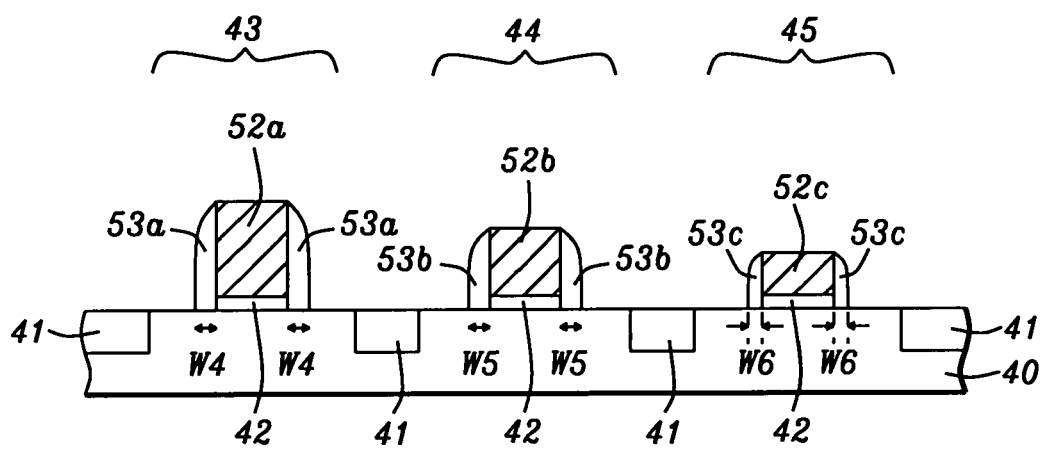

As shown in FIG. 3e, the oxide layer 53 is etched back by a process such as a timed buffered HF dip so that oxide spacers 53a, 53b, and 53c are formed on the sidewalls of gate electrodes 52a, 52b, and 52c, respectively, and oxide layer 53 is removed from the top of gate electrodes 52a, 52b, 52c. Note that the substrate 40 is now exposed between oxide spacers and isolation regions 41. Because gate electrode 52a is thicker than gate electrode 52b which is thicker than gate electrode 52c, oxide spacers 53a have a width $w_4$ that is larger than width $w_5$ for oxide spacers 53b which in turn is larger than width we for oxide spacers 53c. Therefore, three different spacer widths are produced by this method. This is an advantage over prior art where only two spacer widths are provided.

The partially formed transistors 43, 44, 45 are completed by conventional methods including formation of highly doped source/drain (S/D) regions (not shown). Additionally, a self-aligned silicide (salicide) process may be performed to generate metal contacts above highly doped S/D regions and above the gate electrode.

Furthermore, the method of this embodiment may be expanded to generate more than 3 spacer widths. For example, there may be a fourth transistor region (not shown) that has a gate layer 50 similar to the transistor region 45 in FIG. 3c. The gate layer 50 is selectively removed over the fourth transistor region. Then a fourth gate layer (not shown) may be formed over the fourth transistor region and over transistor regions 43, 44, 45. The gate layers are patterned as described previously to form a first gate electrode having a first thickness in transistor region 43, a second gate electrode having a second thickness less than the first thickness in transistor region 44, a third gate electrode with a third thickness less than the second thickness in transistor region 45, and a fourth gate electrode having a fourth thickness less than the third thickness in the fourth transistor region. A conformal oxide layer such as oxide layer 53 is formed in the four transistor regions followed by an etch to form four different oxide spacer widths. In addition to the relationship $w_4 > w_5 > w_6$ for the spacer widths in the transistor regions 43, 44, 45, respectively, the spacer width in the fourth transistor region is less than $w_6$.

The second embodiment also provides for different gate electrode thicknesses. Thus, the method of the second embodiment adds flexibility to a manufacturing process by enabling each type of transistor to be individually optimized for performance. For example, selected transistors can be optimized for better drive current by fabricating a thinner polysilicon gate electrode which leads to better polysilicon activation. Optionally, better drive current is achieved with a thicker gate electrode and a narrower spacer width. The method also allows for larger spacer widths needed for better SCE control in some transistors.

The present invention is also a transistor structure formed by the second embodiment of the present invention. The transistor structure is comprised of a substrate having isolation regions and a plurality of transistor regions including first, second, and third transistor regions with a dielectric layer on the substrate between the isolation regions. There is a gate electrode having a first thickness formed in the first transistor region, a gate electrode having a second thickness less than the first thickness formed in the second transistor region, and a gate electrode having a third thickness less than the second thickness formed in the third transistor region. In addition, there are oxide spacers having a first width formed adjacent to said gate electrode in the first transistor region, oxide spacers having a second width less than the first width formed adjacent to the gate electrode in the second transistor region, and oxide spacers having a third width less than the second width formed adjacent to the gate electrode in the third transistor region.

Figure 4A:
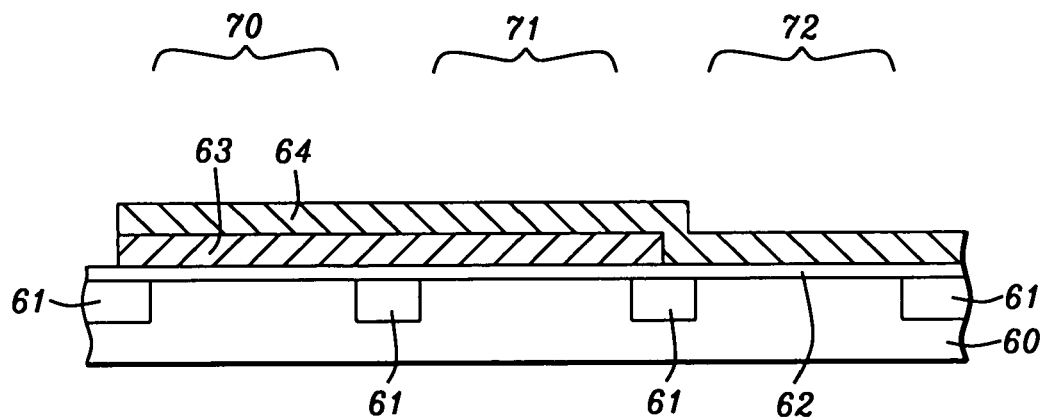
FIGS. 4a–4d are cross-sectional views that depict formation of three spacer widths on a transistor structure according to the third embodiment of the present invention.

In a third embodiment, a combination of different silicon nitride thicknesses as formed in the first embodiment and different gate electrode thicknesses as formed in the second embodiment are employed to produce three or more different spacer widths. The third embodiment is illustrated in FIGS. 4a–4d. Referring to FIG. 4a, a substrate 60 is provided that is typically comprised of a plurality of transistor regions including transistor regions 70, 71, 72. The substrate

60 is also typically comprised of n and p wells (not shown). Transistor regions 70, 71, 72 are separated by isolation regions 61 comprised of an insulating material such as silicon oxide. Preferably, the isolation region 61 is a shallow trench isolation (STI) structure. A gate dielectric layer 62 with a thickness of between 2 and 100 Angstroms is deposited on the substrate 60 by conventional means. The dielectric layer 62 is comprised of silicon oxide, silicon oxynitride, or a metal oxide selected from the group including $Ta_2O_5$, $TiO_2$, $Al_2O_3$, $ZrO_2$, $HfO_2$, $Y_2O_3$ and $La_2O_5$.

A gate layer 63 that is comprised of polysilicon or amorphous silicon, for example, with a thickness of between 100 and 2000 Angstroms is deposited on dielectric layer 62 by a CVD or PECVD technique. The gate layer 63 may be doped or undoped. A photoresist is spin coated on gate layer 63 and baked to form a photoresist layer (not shown) which is patterned to form a photoresist mask in transistor regions 70, 71. An ARC (not shown) comprised of an organic or inorganic material known to those skilled in the art may be coated on gate layer 63 prior to forming the photoresist layer in order to optimize the process latitude for the patterning step. The gate layer 63 in transistor region 72 is removed by an etching process known to those skilled in the art.

The photoresist mask is stripped by a plasma ashing method or with a wet stripper solution. A second gate layer 64 preferably comprised of the same material with a similar thickness as in gate layer 63 is deposited on the substrate including transistor regions 70, 71, 72. Note that the gate layer thickness from combined gate layers 63, 64 is larger in transistor regions 70, 71 than gate layer 64 in transistor region 72.

Figure 4B:
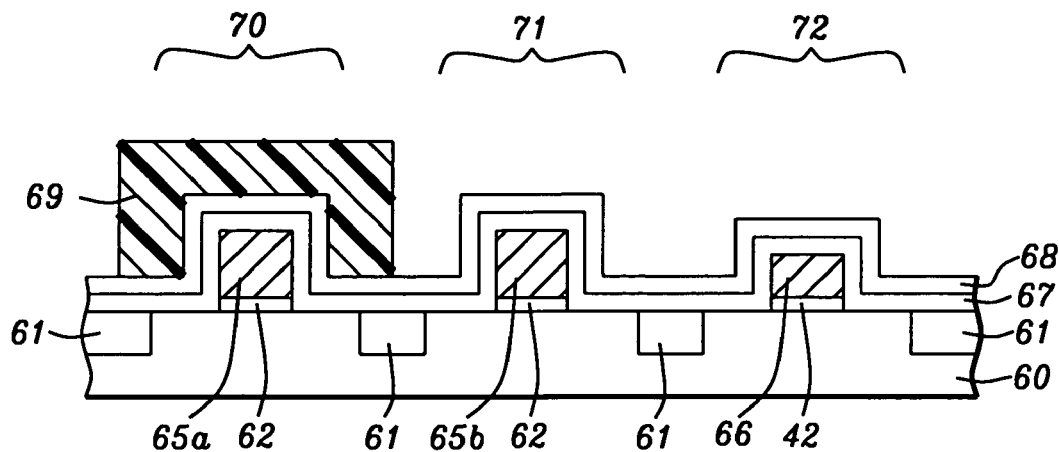

Referring to FIG. 4b, gate electrodes of two different thicknesses are produced according to a method depicted in FIG. 3c in which a photoresist is patterned on a non-uniform gate layer to define a gate electrode in each transistor region. In this example, a photoresist (not shown) is patterned on transistor regions 70, 71, 72 and the pattern is transferred through the one or more gate layers by the same etch process employed in the second embodiment. Then the exposed portions of the dielectric layer 62 are removed by an etch process such as a buffered HF dip. As a result, a gate electrode 65a is formed in transistor region 70, a gate electrode 65b is formed in transistor region 71, and a gate electrode 66 is formed in transistor region 72. Gate electrodes 65a, 65b are comprised of gate layers 63, 64 and have the same thickness while gate electrode 66 is comprised of gate layer 64 and is thinner than gate electrodes 65a, 65b.

An oxide such as silicon oxide is deposited to form a conformal oxide layer 67 with a thickness between about 10 and 1000 Angstroms on gate electrodes 65a, 65b, 66 and on substrate 60. Then silicon nitride is deposited by a CVD or PECVD technique to form a conformal silicon nitride layer 68 having a thickness from about 10 to 1000 Angstroms on oxide layer 67. A photoresist is then coated on silicon nitride layer 68 and patterned to produce a photoresist mask 69 in transistor region 70.

Figure 4C:
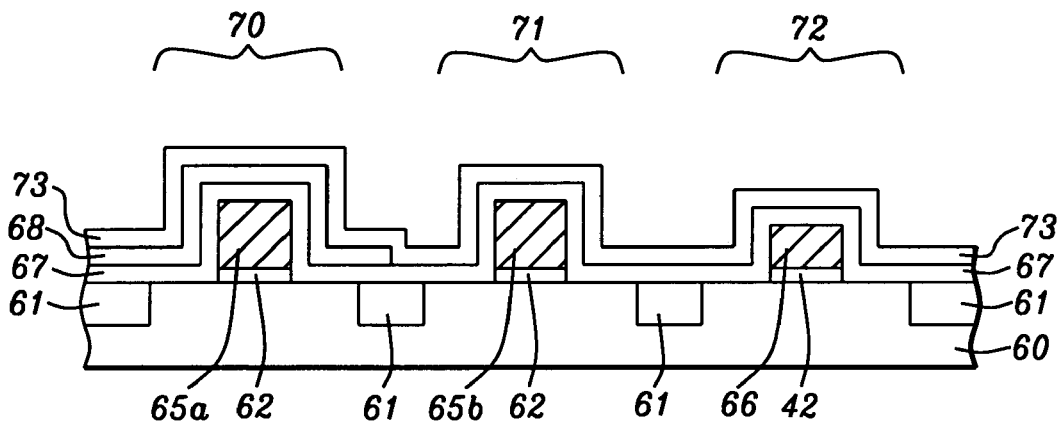

Referring to FIG. 4c, the portion of silicon nitride layer 68 not covered by photoresist mask 69 is removed by an aqueous $H_3PO_4$ solution. The photoresist mask 69 is removed by plasma ashing or with a wet stripper solution. A second silicon nitride layer is deposited by a CVD or PECVD method to give a conformal silicon nitride layer 73 on the substrate including transistor regions 70, 71, 72. Note that the combined thickness of oxide layer 67 and silicon nitride layers 68, 73 in transistor region 70 is larger than the combined thickness of silicon nitride layer 73 and oxide layer 67 in transistor regions 71, 72. Furthermore, the combined thickness of gate electrode 65b, oxide layer 67, and silicon nitride layer 73 in transistor region 71 is greater than the combined thickness of gate electrode 66, oxide layer 67, and silicon nitride layer 73 in transistor region 72.

Figure 4D:
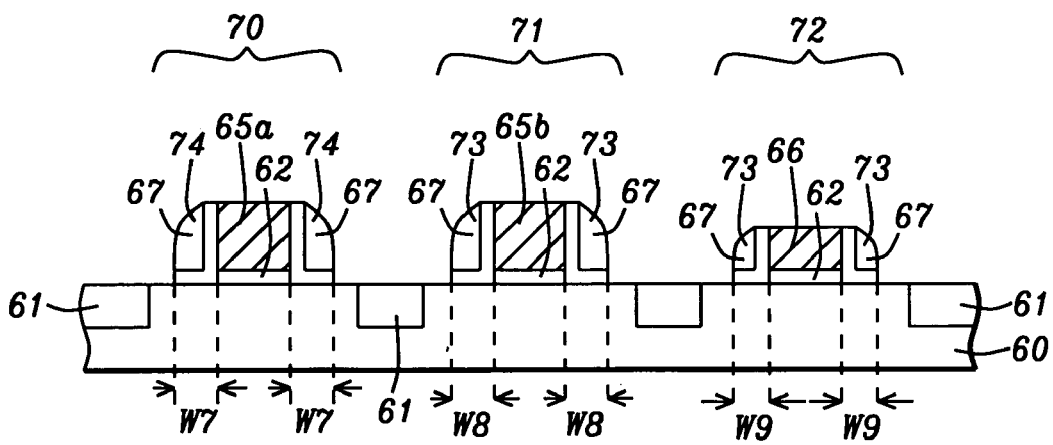

Referring to FIG. 4d, an anisotropic etch process is performed to produce nitride spacers on the oxide layer 67 formed on the sidewalls of gate electrodes 65a, 65b, 66 and dielectric layer 62 in transistor regions 70, 71, 72. Endpoint in a first step is determined when the silicon nitride layer 73 is removed to expose oxide layer 67 on horizontal surfaces of transistor regions 71, 72 and form silicon nitride spacers 73. Then an in-situ over-etch step with the same silicon nitride etch conditions as in the first etch step is performed to produce silicon nitride spacers 74 in transistor region 70. A subsequent etch known to those skilled in the art is performed to remove exposed portions of oxide layer 67 including oxide layer 67 above gate electrodes 65a, 65b, 66 and between spacers 65a, 65b, 66 and isolation regions 61.

It is understood that the oxide layer 67 may also be considered a spacer. The maximum spacer width $w_7$ in transistor region 70 is equivalent to the width of oxide layer 67 on the sidewall of gate electrode 65a plus the width of silicon nitride spacer 74 at its base. The silicon nitride spacer 74 is comprised of silicon nitride layers 68, 73. The maximum spacer width $w_8$ in transistor region 71 is equal to the width of oxide layer 67 on the sidewall of gate electrode 65b plus the width of the adjacent silicon nitride spacer 73 at its base. The maximum spacer width $w_9$ in transistor region 72 is equal to the width of oxide layer 67 on the sidewall of gate electrode 66 plus the width of the adjacent silicon nitride spacer 73 at its base. Note that the width of the silicon nitride spacer 73 in transistor region 72 is less than the width of the silicon nitride spacer 73 in transistor region 71 because the thickness of the gate electrode 66 is less than the thickness of gate electrode 65b. The spacer width $w_7$ in transistor region 70 is larger than spacer width $w_8$ in transistor region 71 and spacer width $w_8$ is larger than spacer width $w_9$ in transistor region 72. Therefore, three different spacer widths are produced by this method. This is an advantage over prior art where only two spacer widths are provided.

The partially formed transistor 70, 71, 72 are completed by conventional methods including formation of highly doped source/drain (S/D) regions (not shown). Additionally, a self-aligned silicide (salicide) process may be performed to form metal contacts above highly doped S/D regions and above the gate electrode.

The method of the third embodiment may be expanded to generate more than three spacer widths. For example, there may be a fourth transistor region (not shown) that has a gate electrode with a thickness less than the thickness of gate electrode 66 which is covered by the oxide layer 67 and a silicon nitride layer 73 on the oxide layer. During the anisotropic etch steps that form nitride spacers 73, 74 in transistor regions 70, 71, 72, spacers comprised of the oxide layer 67 and nitride layer 73 are also formed adjacent to the fourth gate electrode. The spacers in the fourth transistor region have a fourth width which is less than the width of the spacers in transistor region 72 since the thickness of the fourth gate electrode is less than the thickness of gate electrode 66. Thus, four different spacer widths are formed including spacer width $w_7$ in transistor region 70, spacer width $w_8$ in transistor region 71, spacer width $w_9$ in transistor region 72, and the fourth width of the spacers in the fourth transistor region.

The third embodiment has an advantage in that spacer width and polysilicon height can be independently optimized for each transistor region. Selected transistors can be optimized for better drive current by fabricating a shorter polysilicon gate electrode which leads to better polysilicon activation. Optionally, better drive current is achieved with a taller gate electrode and a shorter spacer width. The method also allows for larger spacer widths needed for better SCE control in some transistors.

The present invention is also a transistor structure formed by the method of the third embodiment. The transistor structure is comprised of a substrate having isolation regions and a plurality of transistor regions including first, second, and third transistor regions with a dielectric layer on the substrate between the isolation regions. There is a gate electrode having a first thickness formed over the first and second transistor regions and a gate electrode having a second thickness formed over the third transistor region. In addition, there are oxide spacers having a width formed adjacent to said gate electrodes in the first, second, and third transistor regions. The transistor structure is further comprised of silicon nitride spacers having a first width formed on the oxide spacers in said first transistor region, silicon nitride spacers having a second width less than the first width formed on the oxide spacers in said second transistor region, and silicon nitride spacers having a third width less than the second width formed on the oxide spacers in the third transistor region.

Figure 5A:
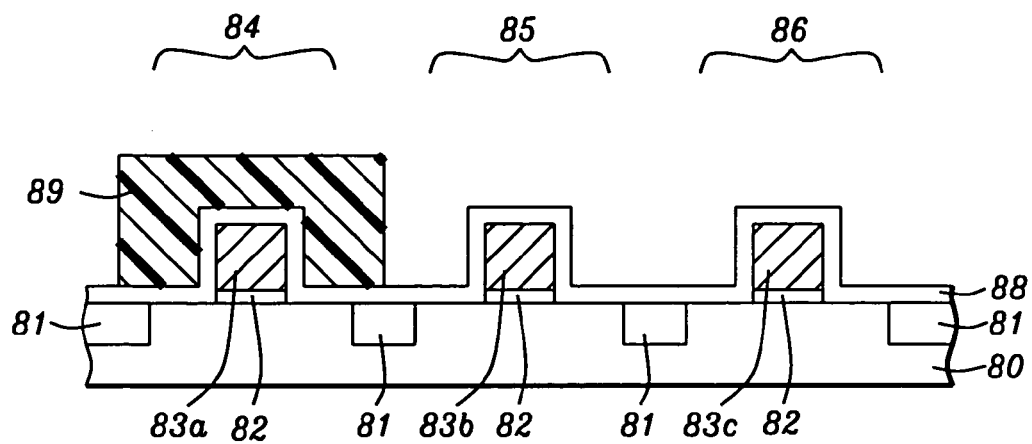
FIGS. 5a–5d are cross-sectional views that illustrate a method of forming three spacer widths on a transistor structure according to a fourth embodiment of the invention.

In a fourth embodiment, three or more different oxide spacer widths are formed adjacent to gate electrodes with equal thicknesses. This embodiment is shown in FIGS. 5a–5d. Referring to FIG. 5a, a substrate 80 is provided that typically has a plurality of transistor regions including transistor regions 84, 85, 86. The substrate 80 is also typically comprised of n and p wells (not shown). Transistor regions 84, 85, 86 are separated by isolation regions 81 comprised of an insulating material such as silicon oxide. In this example, the isolation region 81 is a shallow trench isolation (STI) feature but may be another type of isolation feature used in the art. A gate dielectric layer 82 with a thickness of between 2 and 100 Angstroms is deposited on the substrate 80 by conventional means. The dielectric layer 82 is usually comprised of silicon oxide, silicon oxynitride, or a metal oxide which is a high k dielectric material such as $Ta_2O_5$, $TiO_2$, $Al_2O_3$, $ZrO_2$, $HfO_2$, $Y_2O_3$ and $La_2O_5$. Alternatively, the dielectric layer 82 may be a composite of a high k dielectric layer on an interfacial layer such as silicon oxide, silicon nitride, or silicon oxynitride.

Gate electrodes 83a, 83b, and 83c are formed in transistor regions 84, 85, and 86, respectively, by a method previously described with respect to forming gate electrodes 23 in FIG. 2a. Gate electrodes 83a, 83b, 83c are comprised of polysilicon, amorphous silicon, or another suitable gate material and may be doped or undoped. The gate dielectric layer 82 is removed from substrate 80 by a method known to those skilled in the art except in regions where the dielectric layer is protected by gate electrodes 83a, 83b, 83c. An oxide layer such as silicon oxide is deposited by a CVD or PECVD method to give a conformal oxide layer 88 having a thickness between about 10 and 1000 Angstroms on substrate 80 and in transistor regions 84, 85, 86. Then a photoresist layer is coated on oxide layer 88 and patterned to provide a photoresist mask 89 in transistor region 84.

Figure 5B:
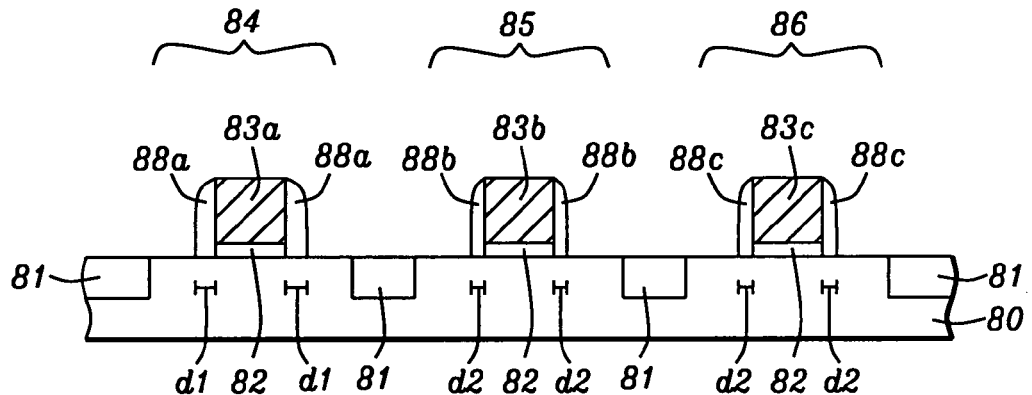

Referring to FIG. 5b, the oxide layer 88 which is not covered by the photoresist mask 89 is thinned by a process such as a timed etch in a buffered HF solution. The photoresist mask 89 is then removed by a plasma ashing or with a wet stripper solution. Next, the oxide layer 88 is etched back by an anisotropic etch. As a result, the oxide layer 88 is removed except along the sidewalls of gate electrodes 83a, 83b, 83c and of gate dielectric layer 82. Spacers 88a having a width $d_1$ are formed in transistor region 84 while spacers 88b having a width $d_2$ are formed in transistor region 85 and spacers 88c having a width $d_2$ are formed in transistor region 86. Spacers 88a are wider than spacers 88b, 88c because the oxide layer 88 is thicker in transistor region 84 prior to the etch back step. The width $d_1$ for spacers 88a may be adjusted by depositing a different thickness of oxide layer 88 or by changing the thickness of gate electrode 83a. Width $d_2$ for spacers 88b, 88c may be adjusted by depositing a different thickness of oxide layer 88, by changing the amount of thinning in the buffered HF treatment, or by changing the thickness of gate electrodes 83b, 83c. Although equivalent gate electrode thicknesses for 83a, 83b, 83c are employed, this method could be modified by forming different gate layer thicknesses as previously described in the second embodiment.

Figure 5C:
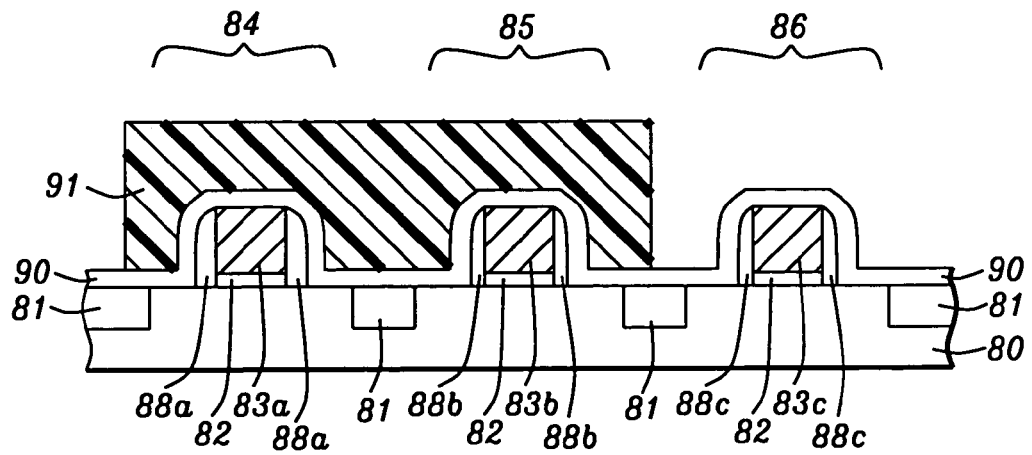

As shown in FIG. 5c, a second oxide layer 90 is deposited on substrate 80 and in transistor regions 84, 85, 86 with a thickness similar to the oxide layer 88 shown in FIG. 5a. A photoresist layer is coated on the oxide layer 90 and patterned to give a photoresist mask 91 in transistor regions 84, 85.

Figure 5D:
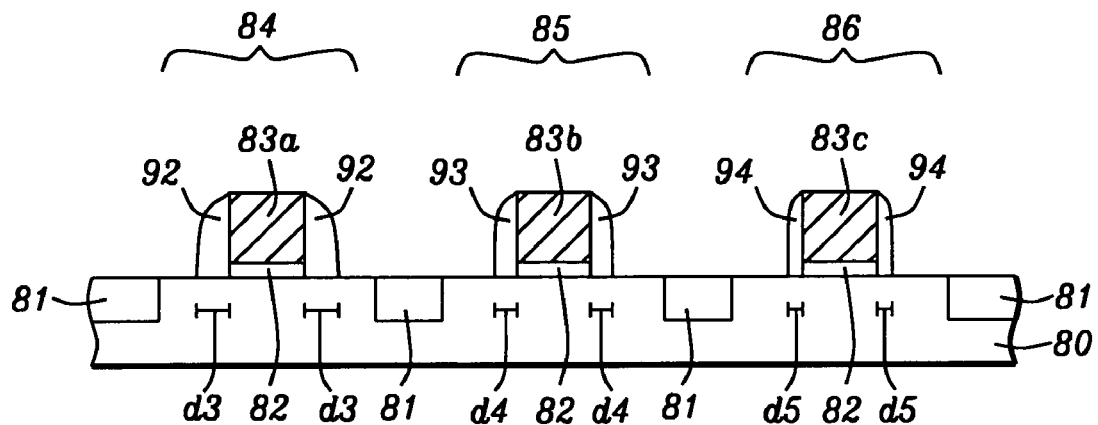

Referring to FIG. 5d, the oxide layer 90 in transistor region 86 that is uncovered by photoresist mask 91 is thinned by a process such as a timed buffered HF dip. The photoresist mask 91 is then removed by plasma ashing or a wet stripper solution. Next, oxide layer 90 is subjected to an etch back method as previously described for etching oxide layer 88. As a result, the oxide layer 90 is removed except along spacers adjacent to gate electrodes 83a, 83b, 83c. The remaining oxide layer 90 in transistor region 84 together with spacers 88a forms spacers 92 having a width $d_3$. The remaining oxide layer 90 in transistor region 85 together with spacers 88b forms spacers 93 having a width $d_4$. The remaining oxide layer 90 in transistor region 86 together with spacers 88c forms spacers 94 having a width $d_5$. Since the oxide layer 90 is thinner in transistor region 86 than in transistor regions 84, 85 prior to the etch back, 6 the width of the etched back oxide layer 90 that is adjacent to spacers 88c is less than the width of the etched back oxide layer 90 that is adjacent to spacers 88b. As a result, spacers 94 have a width $d_5$ less than the width $d_4$ of spacers 93. The width $d_3$ is larger than width $d_4$ because the width of the etched back oxide layer 90 is the same on spacers 88a, 88b and the width $d_1$ of spacers 88a is larger than the width $d_2$ for spacers 88b. Therefore, three different spacer widths with relative sizes of $d_3 > d_4 > d_6$ are produced adjacent to gate electrodes with the same thickness on the substrate 80. This is an advantage over prior art where only two different spacer widths are provided.

The partially formed transistors 84, 85, 86 are completed by conventional methods including formation of highly doped source/drain (S/D) regions (not shown). Additionally, a self-aligned silicide (salicide) process may be performed to form metal contacts above highly doped S/D regions and above the gate electrode.

Furthermore, the method of this embodiment may be expanded to generate more than three different spacer widths. For example, there may be a fourth transistor region (not shown) having a gate electrode with a thickness similar to gate electrodes 83a, 83b, 83c and adjacent spacers having a width $d_6$. A third oxide layer is formed on the transistor regions 84, 85, 86 and on the fourth transistor region. The third oxide layer is selectively thinned over the fourth transistor region by a previously described method that involves a buffered HF dip. The third oxide layer is etched back to form oxide spacers having a first width in transistor region 84, spacers having a second width less than the first width in transistor region 85, spacers having a third width less than the second width in transistor region 86, and spacers having a fourth width less than the third width in the fourth transistor region.

This embodiment enables more flexibility than a conventional process by allowing a different oxide spacer width on different transistors so that each transistor can be independently optimized for improved performance. Thus, a better drive current is achieved for transistors with a shorter spacer width while better SCE control is realized in transistors with larger spacer widths.

The present invention is also a transistor structure formed by the method of the fourth embodiment. The transistor structure is comprised of a substrate having isolation regions and a plurality of transistor regions including first, second, and third transistor regions with a dielectric layer on the substrate between the isolation regions. There is a gate electrode having a first thickness formed over the first, second, and third transistor regions. In addition, there are oxide spacers having a first width formed adjacent to the gate electrode in the first transistor region, oxide spacers having a second width less than the first width formed adjacent to the gate electrode in the second transistor region, oxide spacers having a third width less than the second width formed adjacent to the gate electrode in the third transistor region.

Figure 6A:
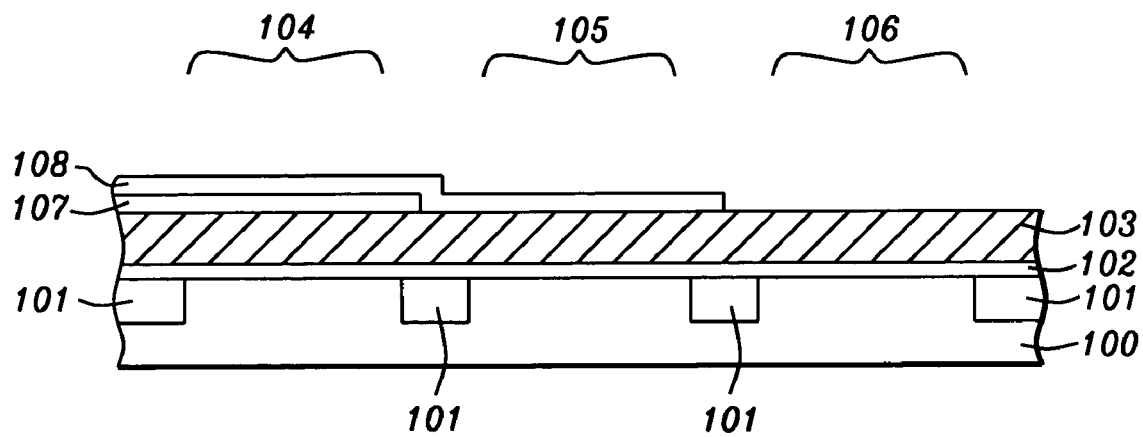
FIGS. 6a–6c are cross-sectional views that illustrate a method of forming three spacer widths on a transistor structure according to a fifth embodiment of the invention.
Figure 6B:
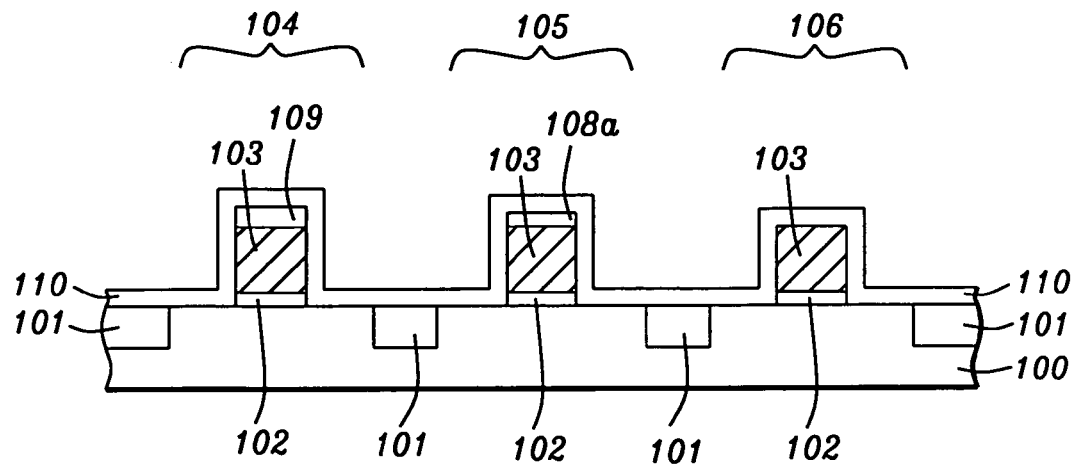
Figure 6C:
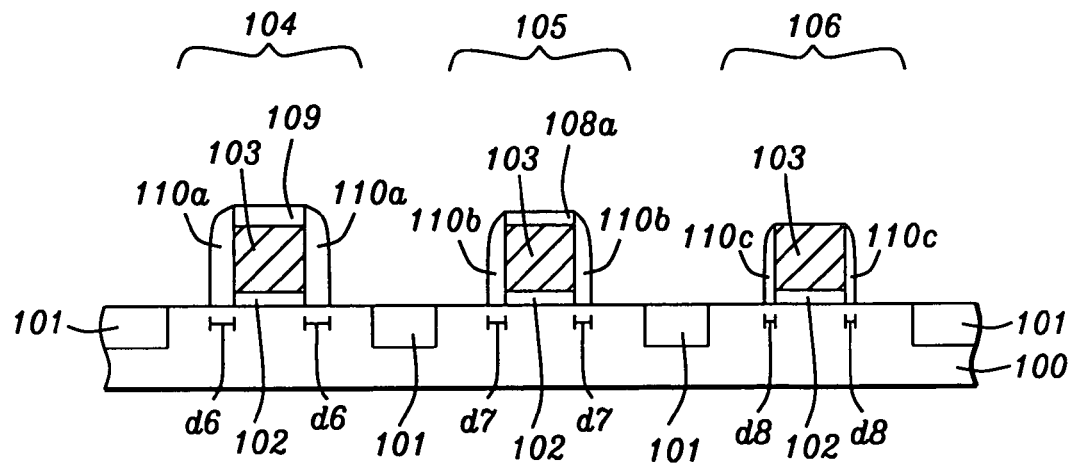

In a fifth embodiment, three or more different spacer widths are formed on gate electrodes by fabricating a different ARC thickness on the gate electrodes as depicted in FIGS. 6a–6c. Referring to FIG. 6a, a substrate 100 is provided that typically has a plurality of transistor regions including transistor regions 104, 105, 106. The substrate 100 is also typically comprised of n and p wells (not shown). Transistor regions 104, 105, 106 are separated by isolation regions 101 comprised of an insulating material such as silicon oxide. The isolation region 101 may be a shallow trench isolation (STI) feature, for example. A gate dielectric layer 102 with a thickness of between 2 and 100 Angstroms is deposited on substrate 100 by conventional means. The dielectric layer 102 is comprised of silicon oxide, silicon oxynitride, or a metal oxide that is a high k dielectric material such as $Ta_2O_5$, $TiO_2$, $Al_2O_3$, $ZrO_2$, $HfO_2$, $Y_2O_3$ and $L_2O_5$. Alternatively, the dielectric layer 102 may be a composite of a high k dielectric layer on an interfacial layer such as silicon oxide, silicon nitride, or silicon oxynitride.

A gate layer 103 such as polysilicon or amorphous silicon with a thickness of between 100 and 2000 Angstroms is deposited on the dielectric layer 102 by a CVD or PECVD technique. The gate layer 103 may be doped or undoped. An anti-reflective coating (ARC) 107 such as an organic material or inorganic material with an appropriate refractive index as appreciated by those skilled in the art is deposited on gate layer 103 to a thickness of about 100 to 2000 Angstroms. For example, an inorganic ARC such as a silicon oxynitride layer may be deposited by a PECVD process. A photoresist is spin coated on the ARC 107 and patterned to form a photoresist masking layer (not shown) that uncovers the ARC 107 in transistor regions 105, 106. Exposed portions of the ARC 107 are removed by a plasma etch process known to those skilled in the art. After the photoresist masking layer is removed, a second ARC 108 is deposited by a spin-on or PECVD method. Preferably, the second ARC 108 is comprised of the same material as in ARC 107. A second photoresist is patterned on the ARC 108 to form a second photoresist mask (not shown) that uncovers ARC 108 in transistor region 106. ARC 108 is removed in transistor region 106 by a plasma etch process similar to the one previously used to remove ARC 107 in transistor regions 105, 106. Then the second photoresist mask is removed by a suitable method.

Referring to FIG. 6b, gate electrodes are formed in each transistor region by first patterning a photoresist (not shown) above the ARCs 107, 108 and gate layer 103 in the transistor regions 104, 105, 106 as appreciated by those skilled in the art. The photoresist mask defines the width of a gate electrode to be fabricated in a subsequent etch step. First, the exposed ARC 108 in transistor region 105 and exposed ARCs 107, 108 in transistor region 104 are removed by a plasma etch using the patterned photoresist as a mask. The photoresist pattern is then transferred through the gate layer 103 by a plasma etch process known to those skilled in the art. The exposed portions of dielectric layer 102 are then removed to expose substrate 100 between adjacent gate electrodes 103. An oxide such as silicon oxide having a thickness between about 10 and 1000 Angstroms is deposited by a CVD or PECVD technique to form a conformal oxide layer 110 on substrate 100.

Referring to FIG. 6c, the oxide layer 110 is etched back by a process such as a timed buffered HF dip so that spacers 110a, 110b, and 110c are formed in transistor regions 104, 105, and 106, respectively. Note that the oxide layer 110 is also removed from above the gate electrodes and that substrate 100 is uncovered between the spacers 110a, 110b, 110c and isolation regions 101. Because the combined thickness of ARC 109 and gate electrode 103 in transistor region 104 is larger than the combined thickness of ARC 108a and gate electrode in transistor region 105, the width $d_6$ of spacers 110a is larger than the width $d_7$ for spacers 10b. Similarly, width $d_7$ is greater than the width $d_8$ for spacers 110c because the combined thickness of ARC 108a and gate electrode 103 in transistor region 105 is larger than the thickness of gate electrode 103 in transistor region 106. Therefore, three different spacer widths adjacent to gate electrodes on substrate 100 are produced by this method.

ARCs 108a, 109 are removed by a method known to those skilled in the art to expose the top of gate electrodes 103 in transistor regions 104, 105. Partially formed transistors 104, 105, 106 are completed by conventional methods including formation of highly doped source/drain (S/D) regions (not shown). Additionally, a self-aligned silicide (salicide) process may be performed to form metal contacts above highly doped S/D regions and above the gate electrode. This embodiment provides the same benefits as described previously for the fourth embodiment. Note that a similar transistor structure is formed as in the fourth embodiment in which the same gate electrode thickness is formed on first, second, and third transistor regions. The spacers adjacent to the gate electrode in the first transistor region have a first width while spacers adjacent to the gate electrode in the second transistor region have a second width less than the first width and spacers adjacent to the gate electrode in the third transistor region have a third width less than the second width.

While this invention has been particularly shown and described with reference to, the preferred embodiment thereof, it will be understood by those skilled in the art that various changes in form and details may be made without departing from the spirit and scope of this invention.

We claim:

1. A method of forming multiple spacer widths on a substrate, comprising:

providing a substrate with isolation regions and a plurality of transistor regions including first, second, and third transistor regions comprised of a dielectric layer on said substrate between said isolation regions;

forming a first gate electrode on said dielectric layer in said first transistor region, a second gate electrode on said dielectric layer in said second transistor region, and a third gate electrode on said dielectric layer in said third transistor region, said first gate electrode having a greater thickness than said second gate electrode and said second gate electrode having a greater thickness than said third gate electrode;

forming an oxide layer on the substrate and on the gate electrodes in said plurality of transistor regions; and etching said oxide layer to form spacers with a first width adjacent to said first gate electrode, spacers having a second width less than said first width adjacent to said second gate electrode, and spacers having a third width less than said second width adjacent to said third gate electrode.

2. The method of claim 1 further comprised of forming a fourth gate electrode on said dielectric layer in a fourth transistor region before forming said oxide layer and wherein the thickness of the fourth gate electrode is less than the thickness of said third gate electrode and wherein etching said oxide layer forms spacers having a fourth width less than said third width adjacent to said fourth gate electrode.

3. A method of forming multiple spacer widths on a substrate, composing:

(a) providing a substrate with isolation regions and a plurality of transistor regions including first, second, and third transistor regions comprised of a dielectric layer on substrate between said isolation regions;

(b) forming a first gate electrode on said dielectric layer in said first transistor region, a second gate electrode on said dielectric layer in said second transistor region, and a third gate electrode on said dielectric layer in said third transistor region, said first gate electrode having a greater thickness than said second gate electrode and said second gate electrode having a greater thickness than said third gate electrode;

(c) forming an oxide layer on the substrate and on the gate electrodes in said plurality of transistor regions;

(d) etching said oxide layer to form spacers with a first width adjacent to said first gate electrode, spacers having a second width less than said first width adjacent to said second gate electrode, and spacers having a third width less than said second width adjacent to said third gate electrode; and (e) forming an anti-reflective coating (ARC) over said first and second gate electrodes before depositing said oxide layer wherein the thickness of said ARC over said second gate electrode is thinner than the thickness of said ARC over said first gate electrode.

4. The method of claim 3 wherein said ARC is comprised of silicon oxynitride that is deposited by a CVD or PECVD method and has a thickness between about 100 and 2000 Angstroms.

5. The method of claim 3 further comprised of removing said ARC after etching said oxide layer.

6. A method of forming multiple spacer widths on a substrate, comprising:

(a) providing a substrate with isolation regions and a plurality of transistor regions including first, second, and third transistor regions comprised of a dielectric layer on said substrate between said isolation regions;

(b) forming a first gate electrode on said dielectric layer in said first transistor region, a second gate electrode on said dielectric layer in said second transistor region, and a third gate electrode on said dielectric layer in said third transistor region, said first gate electrode having a thickness equal to the thickness of said second gate electrode and said third gate electrode having a thickness less than the thickness of said first and second gate electrodes;

(c) forming an oxide layer on said substrate in the plurality of transistor regions;

(d) forming a first silicon nitride layer on said oxide layer in said first transistor region;

(e) forming a second silicon nitride layer on said first silicon nitride layer in said first transistor region and on said oxide layer in said second and third transistor regions; and (f) etching through said silicon nitride layers and through said oxide layer to form spacers having a first width adjacent to said first electrode, spacers having a second width less than said first width adjacent to said second gate electrode, and spacers having a third width less than said second width adjacent to said third gate electrode.

7. The method of claim 6 further comprised of forming a fourth gate electrode having a thickness less than the thickness of said third gate electrode on said dielectric layer in a fourth transistor region before forming said oxide layer, forming a third silicon nitride layer on said second silicon nitride layer in said first, second, and third transistor regions and on said oxide layer in the fourth transistor region, and wherein said etching forms spacers having a fourth width less than said third width adjacent to said fourth gate electrode.

8. A transistor structure, comprising:

a semiconductor substrate having isolation regions and a plurality of transistor regions including first, second, and third transistor regions comprised of a dielectric layer formed on said substrate between said isolation regions;

a gate electrode having a first thickness formed on said dielectric layer in said first transistor region, a gate electrode having a second thickness formed on said dielectric layer in said second transistor region, and a gate electrode having a third thickness formed on said dielectric layer in said third transistor region;

oxide spacers having a width formed adjacent to said gate electrodes in said first, second, and third transistor regions; and silicon nitride spacers having a first width formed on said oxide spacers in said first transistor region, silicon nitride spacers having a second width less than said first width formed on said oxide spacers in said second transistor region, and silicon nitride spacers having a third width less than said second width formed on said oxide spacers in said third transistor region.

9. The transistor structure of claim 8 wherein the width of said oxide spacers is between about 10 and 1000 Angstroms.

10. The transistor structure of claim 8 wherein the first, second, and third widths of said silicon nitride spacers are between about 10 and 1000 Angstroms.

11. The transistor structure of claim 8 further comprised of a fourth gate electrode formed in a fourth transistor region, and oxide spacers formed adjacent to said fourth gate electrode, and silicon nitride spacers having a fourth width that is less than said third width formed on said oxide spacers.

12. A transistor structure, comprising:
(a) a semiconductor substrate having isolation regions and a plurality of transistor regions including first, second, and third transistor regions comprised of a dielectric layer formed on said substrate between said isolation regions;
(b) a gate electrode having a first thickness formed on said dielectric layer in said first transistor region, a gate electrode having a second thickness formed on said dielectric layer in said second transistor region, and a gate electrode having a third thickness formed on said dielectric layer in said third transistor region;
(c) oxide spacers having a width formed adjacent to said gate electrodes in said first, second, and third transistor regions; and
(d) silicon nitride spacers having a first width formed on said oxide spacers in said first transistor region, silicon nitride spacers having a second width less than said first width formed on said oxide spacers in said second transistor region, and silicon nitride spacers having a third width less than said second width formed on said oxide spacers in said third transistor region;
wherein said first thickness and said second thickness are equivalent.

13. The transistor structure of claim 12 wherein said first thickness is greater than said third thickness.

14. A transistor structure, comprising:
a semiconductor substrate having isolation regions and a plurality of transistor regions including first, second, and third transistor regions comprised of a dielectric layer formed on said substrate between said isolation regions;
a gate electrode having a first thickness formed on said dielectric layer in said first transistor region, a gate electrode having a second thickness formed on said dielectric layer in said second transistor region, and a gate electrode having a third thickness formed on said dielectric layer in said third transistor region; and
oxide spacers having a first width formed adjacent to said gate electrode in the first transistor region, oxide spacers having a second width that is less than said first width formed adjacent to said gate electrode in the second transistor region, and oxide spacers having a third width less than said second width formed adjacent to said gate electrode in the third transistor region;
wherein said first thickness, said second thickness, and said third thickness are equivalent.

15. A transistor structure, comprising:
a semiconductor substrate having isolation regions and a plurality of transistor regions including first, second, and third transistor regions comprised of a dielectric layer formed on said substrate between said isolation regions;
a gate electrode having a first thickness formed on said dielectric layer in said first transistor region, a gate electrode having a second thickness formed on said dielectric layer in said second transistor region, and a gate electrode having a third thickness formed on said dielectric layer in said third transistor region;
oxide spacers having a first width formed adjacent to said gate electrode in the first transistor region, oxide spacers having a second width that is less than said first width formed adjacent to said gate electrode in the second transistor region, and oxide spacers having a third width less than said second width formed adjacent to said gate electrode in the third transistor region.

16. The transistor structure of claim 15 wherein said first thickness is greater than said second thickness and said second thickness is greater than said third thickness.

17. The transistor structure of claim 15 wherein the width of said oxide spacers is between about 10 and 1000 Angstroms.

18. The transistor structure of claim 15 further comprised of a fourth gate electrode having a fourth thickness formed in a fourth transistor region and oxide spacers having a fourth width that is less than said third width formed adjacent to said fourth gate electrode.

* * * * *